(12) United States Patent
Shimada

(10) Patent No.: US 6,760,094 B2
(45) Date of Patent: Jul. 6, 2004

(54) ALIGNER

(75) Inventor: Takahiro Shimada, Tokyo (JP)

(73) Assignee: Adtec Engineering Co., Ltd., Tokyo (JP)

( * ) Notice: Subject to any disclaimer, the term of this patent is extended or adjusted under 35 U.S.C. 154(b) by 0 days.

(21) Appl. No.: 10/022,879

(22) Filed: Dec. 18, 2001

(65) Prior Publication Data

US 2002/0118347 A1 Aug. 29, 2002

(30) Foreign Application Priority Data

Feb. 23, 2001 (JP) ........................................ 2001-047826

(51) Int. Cl.$^7$ ........................... G03B 27/42; G03B 27/58
(52) U.S. Cl. ............................................. 355/53; 355/72
(58) Field of Search ............................... 355/53, 72–76; 310/10, 12; 378/34, 35

(56) References Cited

U.S. PATENT DOCUMENTS 5,721,608 A * 2/1998 Taniguchi ..................... 355/53
6,201,597 B1 * 3/2001 Dunn et al. ................... 355/53

FOREIGN PATENT DOCUMENTS

JP      405067551 A * 3/1993
JP      2002-12352 A * 1/2002

* cited by examiner

*Primary Examiner*—Henry Hung Nguyen
(74) *Attorney, Agent, or Firm*—Nields & Lemack

(57) ABSTRACT

A print circuit board is demarcated with arbitrary areas. The print circuit board at one area is partly sucked and fixed on an alignment stage. After alignment with a mask, a pattern of the mask is transferred to the board. Next, shift is made to another area to repeat the same operation, thereby sequentially exposing all the areas to light.

12 Claims, 3 Drawing Sheets

ALIGNER

BACKGROUND OF THE INVENTION AND RELATED ART STATEMENT

1. Field of the Invention

This invention relates to an aligner for light exposure of a master-plate circuit pattern or the like onto a circuit board in the manufacture of a print circuit board.

2. Prior Art

Recently, the photolithography technique for IC fabrication has been used in forming the conductor pattern onto the print circuit board and the like.

This technique uses a master plate depicted with a formation pattern to be exposed to projection light thereby depicting the print circuit board with the same pattern as that of the master plate.

The master plate, usually, uses a film mask. It is a usual practice to carry out exposure in a state the film mask is close contacted with or in proximity onto the print circuit board.

Prior to placing the mask and the circuit board in proximity or close contact, the both require alignment with each other. The mask or the board is moved and aligned in an XYθ direction. Thereafter, the both are brought into close contact for exposure.

Meanwhile, in recent years the circuit board has been reduced in size. For the efficiency in the manufacture process, it is a practice to demarcate a large-sized board into a plurality of areas and repeat exposure to light on the area-by-area basis. Thereafter, the board is cut and used.

OBJECTS OF THE INVENTION

However, the increase of board size has raised a problem of lowered accuracy due to warp or deformation of the board. The board is usually structured to be sucked onto a suction base by a suction mechanism. However, there is a problem that air leak occurs through between the base and the board due to warp or deformation thereby decreasing vacuum and lowering the suction force. Consequently, the board cannot be kept in sufficient flatness upon exposure thus incurring lowering in exposure accuracy.

It is an object of the present invention to solve such a conventional disadvantage.

SUMMARY OF THE INVENTION

In order to achieve the object, the present invention is to provide an aligner comprising a base on which a to-be-exposed substrate is rested and a sucking unit for sucking the to-be-exposed substrate on the base, the sucking unit being capable of sucking the to-be-exposed substrate only at a part thereof. In the case that the aligner is capable of partly exposing the to-be-exposed substrate to light, the substrate can be sucked only at a part to be exposed to light. With this structure, the efficiency of suction is high as compared to the case of sucking the entire substrate, and positive suction is possible even where there is warp or the like in the board, improving exposure efficiency.

In exposure, a photomask is used which has a predetermined pattern. This photomask is arranged for contact with or proximity to the to-be-exposed substrate.

Light is radiated from a light source unit to transfer the pattern of the photomask onto the substrate. In a preferred embodiment, the photomask can be aligned to an arbitrary area of the to-be-exposed substrate so that the to-be-exposed substrate can be exposed to light a plurality of number of times while being changed in area. A sucking unit is structured to suck onto the base the to-be-exposed substrate at each area corresponding to an area for exposure. By a control unit, the to-be-exposed substrate is sucked at each of the areas onto the base and exposed to light after alignment. With this structure, because the substrate can be sucked only at the area correspondingly to an area for exposure, suction efficiency is improved. Due to this, even where there is warp or deformation in the substrate, positive suction is possible. Particularly, where the photomask is of a type to contact the substrate, the weight of the photomask enhances the closeness in contact between the substrate and the base, further improving the suction efficiency in the exposure area.

Incidentally, usually the mask and the aligner are arranged in a vertical direction wherein the mask is arranged vertically above the to-be-exposed substrate. However, the mask and the to-be-exposed substrate can be arranged standing to position the mask and the to-be-exposed substrate with a spacing in a horizontal direction.

DETAILED DESCRIPTION OF PREFERRED EMBODIMENTS

Embodiments of the present invention will be explained below with reference to the drawings.

Figure 1:
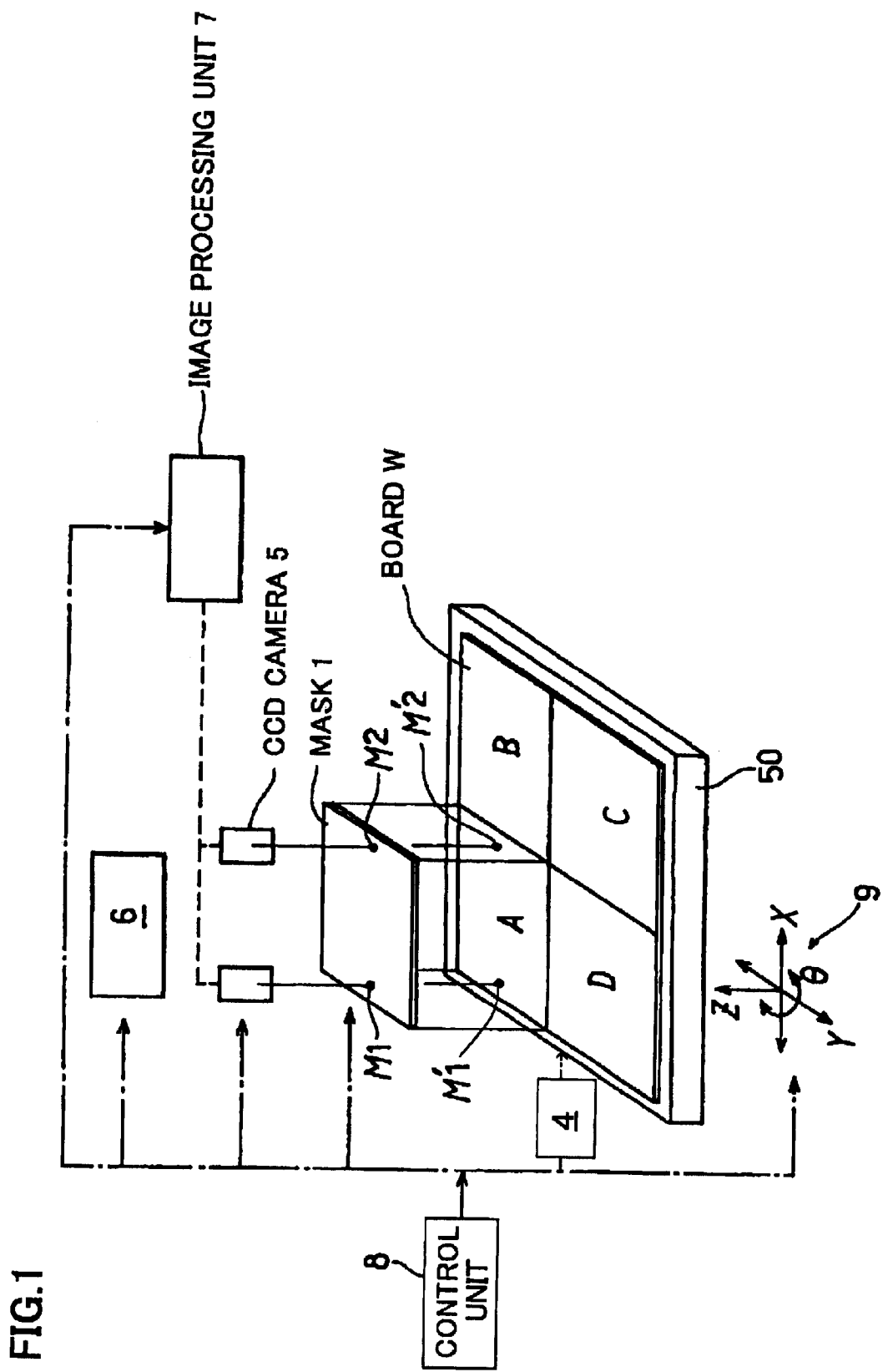
FIG. 1 is a perspective view showing one embodiment of the present invention.

In FIG. 1, an alignment stage 50 is arranged at nearly the center of an aligner. The alignment stage 50 is movable in a planar direction of the stage, i.e. in X and Y directions, and rotatable in a rotation direction (θ direction) about the center point as an axis. The alignment stage 50 is structured movable also in a Z direction so that a print circuit board W can be moved proximate to, abutted against or closely contacted with a mask 1.

The print circuit board W, a substrate to be transferred with interconnection, is rested on the alignment stage 50 so that it can be sucked and fixed by a sucking unit 4 as a fixing unit. The print circuit board W is transported by a conveyor from the previous line and rested on the alignment stage 50 where it is pattern-transferred and then transported to the next process by the conveyor.

As described above, the mask 1 is positioned above the alignment stage 50, further above which a light source unit 6 is arranged. The mask 1 is structured such that the pattern depicted thereon can be projected and transferred onto the print circuit board W by the light from the light source unit 6.

Incidentally, the light source unit 6 has a light radiation area in nearly the same size as that of the mask 1.

CCD cameras 5 are provided above the both sides of the mask 1, to perform position detection of the mask 1 and print circuit board W on the alignment stage 50 thus enabling positional alignment.

The alignment stage 50, the print circuit board W, the mask 1, the CCD cameras 5 and the light source unit 6 are arranged in the vertical direction in the embodiment of FIG. 1. This is not limitative, i.e. these can be arranged in the horizontal direction. In this case, the alignment stage 50 and the print circuit board W are arranged standing, wherein there is an advantage in countermeasure for clean, i.e. dusts are prevented from falling onto the print circuit board W.

The print circuit board W is demarcated into an arbitrary number of areas for exposure. This, in this embodiment, is demarcated into four areas A, B, C and D. The mask 1 is depicted with a circuit pattern to be transferred to each area. The circuit pattern depicted on the mask 1 is sequentially transferred to the areas.

A control unit 8 controls a moving unit 9 to move the alignment stage 50 at high speed, i.e. configured to move the print circuit board W, step by step, such that the mask 1 is overlapped with the next area each time exposure is completed in each area.

As shown in FIG. 1, the mask 1 and the print circuit board W are respectively provided with positioning marks M, M' in their proper positions. The positioning marks M, M' are aligned by moving the alignment stage 50 by the moving unit 9 in the X, Y or θ direction in each of the A, B, C and D areas. Thus, alignment is made between the mask 1 and the print circuit board W. Meanwhile, the mask 1 and the print circuit board W can be neared or closely contacted with by the movement in the Z direction due to the moving unit 9.

Such control can be carried out by the control unit 8 serving also as a positioning unit.

Figure 2:
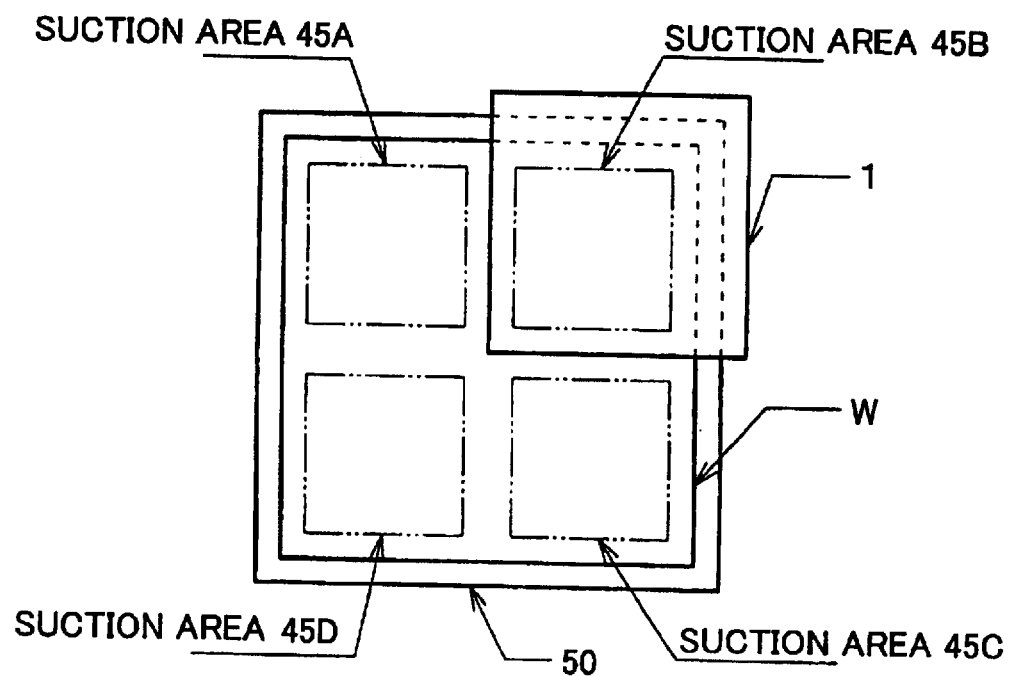
FIG. 2 is a plan view explaining one embodiment of the invention.

Correspondingly to the demarcated areas on the print circuit board W, the print circuit board W is sucked at each demarcated area by the sucking unit 4, as shown in FIG. 2. In this embodiment, the sucking area is demarcated as 45A, 45B, 45C and 45D so that the print circuit board W can be sucked at each area.

The sucking unit 4 is structured with suction ports 40, a suction chamber 41, a switching valve 42, a suction pump 43 and the control unit 44. The suction ports 40, communicating with the suction chamber 41, opens in the upper surface of the alignment stage 50 to suck a print circuit board W. The suction chamber 41 is formed in plurality correspondingly to the suction areas 45A, 45B, 45C, 45D. The suction chambers 41A, 41B, 41C, 41D are connected to the suction chamber 43 through the switching valve 42. By switching the switching valve 42, the suction chamber 41A, 41B, 41C, 41D is selectively sucked thus realizing partial suction at each suction area 45.

The switching valve 42 is controlled by the control unit 44. The control unit 44 interacts with the control unit 8, to cause suction in an area of the suction area 45 corresponding to an area where exposure is to be made.

With this structure, even if there is warp or deformation in the print circuit board W, suction is only at an area for exposure. Accordingly, positive suction is possible while maintaining vacuum. This makes it possible to realize accurate exposure while maintaining flatness of the print circuit board W.

Incidentally, in the foregoing step movement and positioning, the alignment stage 50 and the mask 1 may be moved relative to each other. Namely, it is satisfactory to move only the alignment stage 50 as in the shown embodiment or move only the mask 1. Meanwhile, it is also possible to provide a structure for movement of both the mask 1 and the alignment stage 50. Furthermore, it is also possible to structure with separation in movement direction, e.g. the alignment stage 50 is movable in X and Y directions while the mask 1 is movable in θ and Z directions.

Meanwhile, although the alignment stage 50 is made for precise movement such as step movement and alignment as explained above, step movement and alignment can be structured by providing different stages.

Alignment between the marks M, M' is confirmed by the CCD cameras 5. Such confirmation may be visual confirmation by the operator, or due to image recognition by an image processing unit 7 using a computer as shown in this embodiment. In this case, it is possible to simultaneously control the movement of the alignment stage 50 thereby completely automating for alignment.

Incidentally, the CCD cameras 5 are structured movable, i.e. to be moved correspondingly to an area being aligned and, after completing alignment, retracted not to interfere with exposure.

It is desired that, where the mask 1 is to be moved as in the foregoing, the CCD cameras 5 are also moved together with the mask 1.

In the above structure, the control unit 8 controls the moving unit 9 to carry out exposure in the areas A, B, C and D in the order, thus printing the circuit pattern of the mask 1 to the areas A, B, C and D. At the same time, the control unit 44 of the sucking unit 4 controls the switching valve 42 to suck the print circuit board W at the suction area 45 corresponding to an area for exposure and cause the print circuit board W to be closely contacted on the alignment stage 50.

Namely, first the moving unit 9 moves the alignment stage 50 at high speed to position the area A beneath the mask 1. Simultaneously, the control unit 44 sucks the suction area 45A. Next, the CCD cameras 5 are moved to the alignment marks M, M' to carry out alignment of the area A. Due to this, even if there is warp or deformation in the print circuit board W, the print circuit board W is secured in flatness.

Completing the alignment of the area A, exposure is made in the area A. Because the flatness in the print circuit board W is maintained, exposure is done with accuracy.

Completing the exposure in the area A, the alignment stage 50 is step-operated by the moving unit 9 to position the area B beneath the mask 1. Alignment and suction are made in the similar way thus carrying out exposure.

The above operation is repeated to carry out positioning of and exposure in the areas A, B, C and D in the order, to complete exposure in all the areas.

Figure 3:
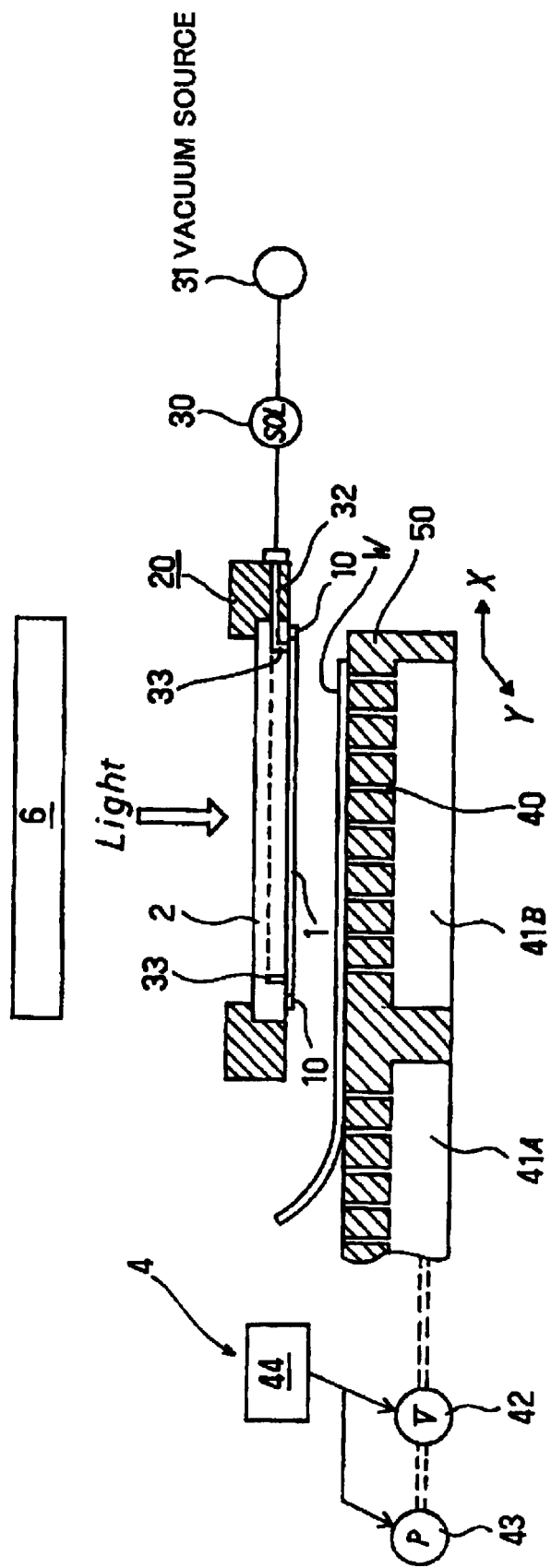
FIG. 3 is a front view explaining one embodiment of the invention.

Incidentally, in FIG. 3, the mask 1 uses a film mask sucked on the underside of a glass plate 2. Namely, this is sucked and fixed by a discharge port 32, discharge groove 33, air switching valve 30 and vacuum source 31 and further adhered by an adhesive tape 10.

Incidentally, the glass plate 2 may be structured by another transparent material such as acryl, i.e. a material may be used that transmits projection light from the light source unit 6 provided above the glass plate 2.

In the above structure, a print circuit board W is rested on the alignment stage 50 as described before. A predetermined first area is positioned to a position corresponding to the mask 1, thereby carrying out alignment. At this time, sucked is a suction area 45 corresponding to that area.

Then, the alignment stage 50 is raised to abut and close contact the print circuit board W against and with the mask 1. In this state, light is radiated by the light source unit 6 from above the glass plate 2 to transfer the pattern of the mask 1 onto the print circuit board W. Because the mask 1 is aligned with the print circuit board W with accuracy and positively, closely contacted therewith, exposure is realized with extreme alignment accuracy.

After ending exposure in one area, the alignment stage 50 is lowered and the alignment stage 50 is step-moved and the next area is positioned to a position corresponding to the mask 1, thereby carrying out exposure in the next area similarly to the foregoing operation.

After the above operation is repeated and exposure is completed in all the areas, the print circuit board W is taken out and sent to the following process.

As explained in the above, the present invention carries out exposure by demarcating a print circuit board into arbitrary areas and sucking the print circuit board W at each area. Accordingly, even if there is warp or deformation in the print circuit board W, the print circuit board W can be positively sucked because of alignment. Due to this, there is an effect that the print circuit board W can be maintained in flatness making possible accurate exposure.

What is claimed is:

1. An aligner comprising:
   a base for resting a to-be-exposed substrate thereon;
   a sucking unit for sucking the to-be-exposed substrate on said base;
   a first control unit for relative positioning of a mask having a pattern and a portion of said substrate to be exposed to light through said pattern; and
   a second control unit interacting with said first control unit for instructing said sucking unit to suck said substrate on said base only at said portion.

2. An aligner according to claim 1, wherein the photomask is positioned vertically above the to-be-exposed substrate.

3. An aligner according to claim 1, wherein the photomask and the to-be-exposed substrate are positioned with a spacing nearly in a horizontal direction.

4. An aligner comprising:
   a base for resting a to-be-exposed substrate thereon;
   a photomask having a predetermined pattern for projection onto the to-be-exposed substrate on said base and to be contacted with or proximate to the to-be-exposed substrate;
   a moving unit for moving at least one of said photomask and said base to change and set a relative positional relationship between them;
   a light source unit for radiating light for projection of the pattern of said photomask onto the to-be-exposed substrate on said base;
   an alignment unit for aligning the photomask and the to-be-exposed substrate in an arbitrary area of the to-be-exposed substrate;
   a sucking unit for sucking the to-be-exposed substrate at said arbitrary area on said base;
   a first control unit controlling said moving unit, said aligning unit, and said light source unit such that after alignment, the to-be-exposed substrate is exposed to light, and
   a second control unit, interacting with and responsive to said first control unit, for instructing said sucking unit to suck the to-be-exposed substrate at said arbitrary area.

5. An aligner according to claim 4, wherein the photomask is positioned vertically above the to-be-exposed substrate.

6. An aligner according to claim 4, wherein the photomask and the to-be-exposed substrate are positioned with a spacing nearly in a horizontal direction.

7. An aligner comprising:
   a base for resting a to-be-exposed substrate thereon;
   a photomask having a predetermined pattern for projection onto the to-be-exposed substrate on said base and to be contacted with the to-be-exposed substrate;
   a moving unit for moving at least one of said photomask and said base to change and set a relative positional relationship between them;
   a light source unit for radiating light for projection of the pattern of said photomask contacting the to-be-exposed substrate onto the to-be-exposed substrate on said base;
   an alignment unit for aligning such that the photomask is to contact an arbitrary area of the to-be-exposed substrate;
   a sucking unit for sucking the to-be-exposed substrate only at said arbitrary area on said base;
   a first control unit controlling said moving unit, said aligning unit, and said light source unit such that after alignment, the to-be-exposed substrate is exposed to light, and
   a second control unit, interacting with and responsive to said first control unit, for instructing said sucking unit to suck the to-be-exposed substrate at said arbitrary area.

8. An aligner according to claim 7, wherein the photomask is positioned vertically above the to-be-exposed substrate.

9. An aligner according to claim 7, wherein the photomask and the to be exposed substrate are positioned with a spacing nearly in a horizontal direction.

10. A method of exposing a portion of a substrate to alight pattern, comprising:
    a. providing a substrate to be exposed to light,
    b. providing a base for supporting said substrate;
    c. providing a photomask having a pattern;
    d. positioning said substrate relative to said photomask so as to expose only a portion of said substrate to said pattern;
    e. exposing said substrate to light through said mask only at said portion while sucking said substrate on said base only at said portion.

11. The method of claim 10, whereby said photomask is positioned vertically above said substrate.

12. The method of claim 10, whereby said photomask contacts said substrate.

* * * * *